United States Patent
Hargrove et al.

(10) Patent No.: US 9,472,554 B2
(45) Date of Patent: Oct. 18, 2016

(54) INTEGRATED CIRCUITS HAVING FINFET SEMICONDUCTOR DEVICES AND METHODS OF FABRICATING THE SAME TO RESIST SUB-FIN CURRENT LEAKAGE

(71) Applicant: GLOBALFOUNDRIES, Inc., Grand Cayman (KY)

(72) Inventors: Michael Hargrove, Clinton Corners, NY (US); Yanxiang Liu, Wappingers Falls, NY (US); Christian Gruensfelder, Dresden (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 13/955,693

(22) Filed: Jul. 31, 2013

(65) Prior Publication Data

US 2015/0034941 A1  Feb. 5, 2015

(51) Int. Cl.
*H01L 21/8234* (2006.01)
*H01L 27/092* (2006.01)
*H01L 21/8238* (2006.01)

(52) U.S. Cl.
CPC ... *H01L 27/0924* (2013.01); *H01L 21/823821* (2013.01)

(58) Field of Classification Search
CPC .......... H01L 21/8232–21/823431; H01L 21/845–21/86; H01L 27/088–27/0924; H01L 27/10826; H01L 27/10879; H01L 27/1211; H01L 29/41791; H01L 29/66772; H01L 29/66795; H01L 29/7831–29/7834; H01L 29/785; H01L 2029/7858; H01L 2924/13067
See application file for complete search history.

(56) References Cited

U.S. PATENT DOCUMENTS

| | | | |
|---|---|---|---|
| 2005/0266647 A1* | 12/2005 | Kim et al. | 438/296 |
| 2007/0020902 A1* | 1/2007 | Chung | H01L 21/823412 438/589 |
| 2007/0111448 A1* | 5/2007 | Li et al. | 438/264 |
| 2008/0014711 A1* | 1/2008 | Choi et al. | 438/424 |

\* cited by examiner

*Primary Examiner* — Cuong B Nguyen
(74) *Attorney, Agent, or Firm* — Lorenz & Kopf, LLP

(57) ABSTRACT

Integrated circuits that have a FinFET and methods of fabricating the integrated circuits are provided herein. In an embodiment, a method of fabricating an integrated circuit having a FinFET includes providing a substrate comprising fins. The fins include semiconductor material. A first metal oxide layer is formed over sidewall surfaces of the fins. The first metal oxide layer includes a first metal oxide. The first metal oxide layer is recessed to a depth below a top surface of the fins to form a recessed first metal oxide layer. The top surface and sidewall surfaces of the fins at a top portion of the fins are free from the first metal oxide layer. A gate electrode structure is formed over the top surface and sidewall surfaces of the fins at the top portion of the fins. The recessed first metal oxide layer is recessed beneath the gate electrode structure.

12 Claims, 4 Drawing Sheets

INTEGRATED CIRCUITS HAVING FINFET SEMICONDUCTOR DEVICES AND METHODS OF FABRICATING THE SAME TO RESIST SUB-FIN CURRENT LEAKAGE

TECHNICAL FIELD

The technical field generally relates to integrated circuits having a fin field-effect transistors (FinFET) and methods of fabricating the same, and more particularly relates to integrated circuits having a FinFET that resist sub-fin current leakage and methods of fabricating the integrated circuits.

BACKGROUND

Transistors such as metal oxide semiconductor field effect transistors (MOSFETs) or simply field effect transistors (FETs) are the core building blocks of the vast majority of semiconductor integrated circuits (ICs). A FET includes source and drain regions between which a current can flow through a channel under the influence of a bias applied to a gate electrode that overlies the channel. Some semiconductor ICs, such as high performance microprocessors, can include millions of FETs. For such ICs, decreasing transistor size and thus increasing transistor density has traditionally been a high priority in the semiconductor manufacturing industry. Transistor performance, however, must be maintained even as the transistor size decreases.

A Fin field-effect transistor (FinFET) is a type of transistor that lends itself to the dual goals of reducing transistor size while maintaining transistor performance. The FinFET is a three dimensional transistor formed using a thin fin that extends upwardly from a semiconductor substrate. Transistor performance, often measured by its transconductance, is proportional to the width of the transistor channel. In a FinFET the transistor channel is formed along the vertical sidewall surfaces of the fin or on both vertical sidewall surfaces and the top horizontal plane of the fin, so a wide channel, and hence high performance, can be achieved without substantially increasing the area of the substrate surface required by the transistor.

FinFETs provide a promising candidate for small line width technology (e.g., approximately 22 nm and below) because of their excellent short channel effect control and scalability. However, FinFETs are often formed as an array on a bulk substrate or a silicon-on-insulator (SOI) substrate in an integrated circuit, with the FinFETs densely formed on the substrates and with the substrates including a base that connects the fins. The integrate circuits that include the FinFETs often suffer from sub-fin current leakage, especially when the FinFETs are formed on a bulk substrate, whereby some of the current that is passed between a source and drain for one FinFET passes through a body of the fin to other FinFETs that are formed on the fin, thereby affecting operation of the FinFETs on the fin.

Various solutions to minimize or prevent current leakage have been proposed. For example, silicon-on-insulator configurations have been employed to hinder current leakage between fins. Dopant implantation has also been applied to hinder current leakage in configurations where the fins are formed in bulk semiconductor material. In particular, with dopant implantation to hinder current leakage, bulk semiconductor material between fins and at a bottom of the fins, where the fins attach to the bulk substrate, is doped with a dopant that hinders flow of current therethrough. However, dopant implantation to hinder current leakage is difficult to accurately control and may adversely impact desired operation of the FinFETs.

Accordingly, it is desirable to provide integrated circuits that have FinFETs and methods of fabricating the integrated circuits that have FinFETs that resist sub-fin current leakage without adversely impacting desired operation of the FinFETs in the integrated circuits. Furthermore, other desirable features and characteristics of the present invention will become apparent from the subsequent detailed description of the invention and the appended claims, taken in conjunction with the accompanying drawings and this background of the invention.

BRIEF SUMMARY

Integrated circuits having a FinFET and methods of fabricating the integrated circuits having the FinFET are provided herein. In an embodiment, a method of fabricating an integrated circuit having a FinFET includes providing a substrate comprising fins. The fins include semiconductor material. A first metal oxide layer is formed over sidewall surfaces of the fins. The first metal oxide layer includes a first metal oxide. The first metal oxide layer is recessed to a depth below a top surface of the fins to form a recessed first metal oxide layer. The top surface and sidewall surfaces of the fins at a top portion of the fins are free from the first metal oxide layer. A gate electrode structure is formed over the top surface and sidewall surfaces of the fins at the top portion of the fins. The recessed first metal oxide layer is recessed beneath the gate electrode structure.

In another embodiment, a method of fabricating an integrated circuit having a FinFET includes providing a substrate comprising fins. The fins include semiconductor material. A first metal oxide layer is formed over sidewall surfaces of the fins. The first metal oxide layer includes a first metal oxide. A first fin is selectively masked after forming the first metal oxide layer. A second fin remains exposed after selectively masking the first fin. A second metal oxide layer is formed over the first metal oxide layer on the second fin. The second metal oxide layer includes a second metal oxide that is different from the first metal oxide. A dielectric material that is different from the first metal oxide and the second metal oxide is deposited over the first metal oxide layer and the second metal oxide layer, where present, to form a dielectric layer. The first metal oxide layer and the second metal oxide layer are recessed, after depositing the dielectric material, to a depth below a top surface of the fins to form a recessed first metal oxide layer and a recessed second metal oxide layer. The first metal oxide layer and the second metal oxide layer are recessed with an etchant that is selective to the first metal oxide and the second metal oxide over the dielectric material. The top surface and sidewall surfaces of the fins at a top portion of the fins are free from the first metal oxide layer and the second metal oxide layer. A portion of the dielectric layer is removed to a depth of at least a depth of the recessed first metal oxide layer to form a recessed dielectric layer. Additional dielectric material is deposited over the recessed first metal oxide layer and over the recessed dielectric layer to form a reformed dielectric layer. The reformed dielectric layer is recessed to a depth above the recessed first metal oxide layer. A gate electrode structure is formed over the top surface and sidewall surfaces of the fins at the top portion of the fins. The recessed first metal oxide layer and the recessed second metal oxide layer are recessed beneath the gate electrode structure.

In another embodiment, an integrated circuit having a FinFET is provided. The integrated circuit includes a substrate that includes fins. The fins include semiconductor material. A recessed first metal oxide layer is disposed over sidewall surfaces of the fins. The recessed first metal oxide layer includes a first metal oxide. The recessed first metal oxide layer is recessed to a depth below a top surface of the fins with the top surface and sidewall surfaces of the fins at a top portion of the fins free from the recessed first metal oxide layer. A gate electrode structure is disposed over the top surface and sidewall surfaces of the fins at the top portion of the fins. The recessed first metal oxide layer is recessed beneath the gate electrode structure.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description.

Provided herein are integrated circuits that have a fin field-effect transistor (FinFET) and methods of fabricating the integrated circuits having the FinFET that resist sub-fin current leakage without adversely impacting desired operation of the FinFETs through sub-gate electrode insulation of fins with a metal oxide. In particular, the integrated circuits include a substrate that includes fins, and a recessed first metal oxide layer is disposed over sidewall surfaces of the fins. The recessed first metal oxide layer is recessed to a depth below a top surface of the fins with the top surface and sidewall surfaces of the fins at a top portion of the fins free from the first metal oxide layer. A gate electrode structure is disposed over the top surface and sidewall surfaces of the fins at the top portion of the fins, and the recessed first metal oxide layer is recessed beneath the gate electrode structure. In this regard, the recessed first metal oxide layer is absent from between the gate electrode structure and the fins while remaining on lower portions of the fins to provide enhanced electrical insulation beneath the gate electrode structure. In this manner, the recessed first metal oxide layer effectively gates a source/drain path and increases voltage thresholds between FinFETs, thereby effectively hindering sub-fin current leakage that could impact operation of other FinFETs on the fins. Further, because the recessed first metal oxide layer is recessed beneath the gate electrode structure, desired operation of the FinFETs remains unaffected by the presence of the recessed first metal oxide layer.

Figure 1:
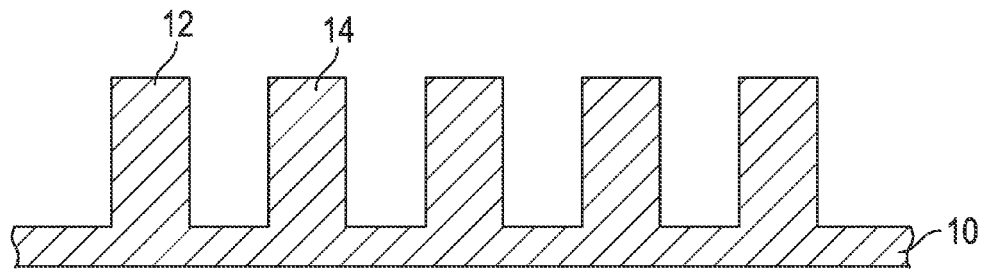
FIGS. 1-10 are cross-sectional side views illustrating an exemplary method of fabricating an integrated circuit having a FinFET in accordance with an embodiment, with FIG. 10 illustrating an exemplary integrated circuit having a FinFET fabricated in accordance with the exemplary method.

Referring to FIG. 1, in accordance with an exemplary embodiment of a method for fabricating an integrated circuit having a FinFET, a substrate 10 is provided that includes fins 12, 14 formed therein or thereon. In the embodiment shown in FIG. 1, the substrate 10 includes a first fin 12, a second fin 14, and additional fins in accordance with conventional fin configurations for integrated circuits that have FinFETs. Without intending to be limiting, the fins 12, 14 may have a width on the nanometer scale, such as from about 10 to about 30 nm, although the FinFETs and methods described herein are not limited to any particular dimensional constraints. The fins 12, 14 include semiconductor material and enable later formation of FinFETs thereon. As used herein, the phrase "semiconductor material" includes monocrystalline silicon materials, such as relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. In the embodiment shown in FIG. 1, the substrate 10 is a bulk silicon material with the fins 12, 14 formed in the bulk silicon material. However, it is to be appreciated that in other embodiments and although not shown in the Figures, the substrate 10 may be provided as a silicon-on-insulator (SOI) substrate with the fins including semiconductor material and with the fins formed on an insulating material structure that, in turn, may be supported by a support substrate. For illustrative purposes, only a portion of the substrate 10 including the fins 12, 14 is shown in FIG. 1. In an embodiment, different fins 12, 14 are doped with a P-type dopant in anticipation of forming an N-type metal oxide semiconductor (NMOS) FinFET, or an N-type dopant in anticipation of forming a P-type metal oxide semiconductor (NMOS) FinFET. In this regard, the methods described herein are suitable for forming integrated circuits that include NMOS FinFETs, PMOS FinFETs, or complimentary MOS integrated circuits (CMOS IC) (which include both NMOS FinFETs and PMOS FinFETs). Conventional techniques may be employed to dope the substrate 10 prior to or after forming the fins 12, 14.

Figure 2:
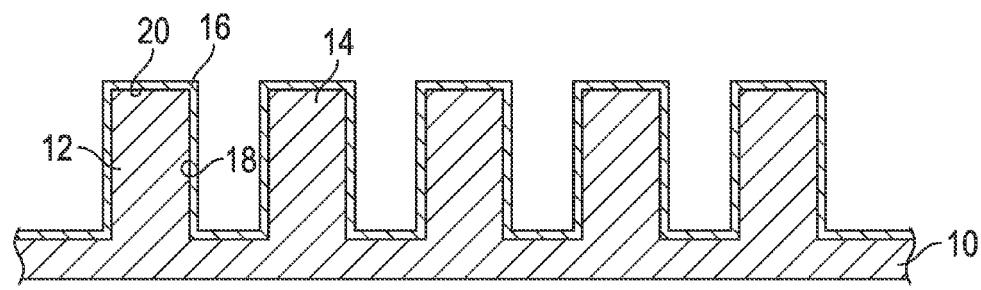

In an embodiment and as shown in FIG. 2, a first metal oxide layer 16 is formed over sidewall surfaces 18 of the fins 12, 14. In particular, the first metal oxide layer 16 may be formed by conformally depositing a first metal oxide over the substrate 10 and the fins 12, 14 to form the first metal oxide layer 16. In this regard, the first metal oxide layer 16 may be disposed on a top surface 20 of the fins 12, 14, as well as over the substrate 10 between the fins 12, 14, although it is to be appreciated that presence of the first metal oxide over features other than the sidewall surfaces 18 is optional. The first metal oxide may be any insulative metal oxide, such as a high dielectric constant ("high-k") metal oxide. As used herein, high dielectric constant or "high k" means having a dielectric constant greater than silicon (dielectric constant of 3.7). Examples of suitable metal oxides for the first metal oxide include, but are not limited to, hafnium oxide, tungsten oxide, iridium oxide, aluminum oxide, and the like. Particular metal oxides chosen for the first metal oxide layer 16 may be dependent upon configuration and types of FinFETs that are to be formed on the fins 12, 14, with certain metal oxides more effective for insulating N-type FinFETs over P-type FinFETs, and vice versa. In a specific embodiment, the first metal oxide is hafnium oxide. The first metal oxide layer 16 may be formed through techniques that are suitable for forming Angstrom-scale conformal layers, such as atomic layer deposition (ALD) techniques. In embodiments, the first metal oxide layer 16 has a thickness of from about 2 Å to about 20 Å.

Figure 3:
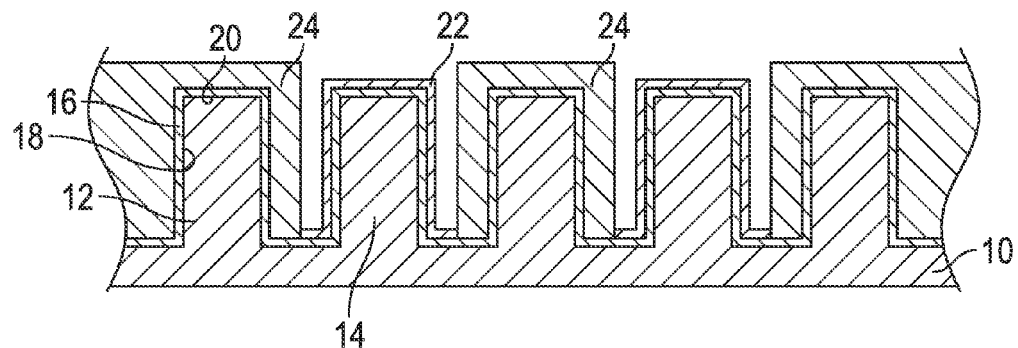

In an embodiment and as shown in FIG. 3, the first fin 12 is selectively masked after forming the first metal oxide layer 16, with the second fin 14 remaining exposed after selectively masking the first fin 12. Conventional masking techniques may be employed to form masks 24 that are employed for selective masking. In this embodiment, selective masking of the first fin 12 is employed to enable formation of a second metal oxide layer 22 over the first metal oxide layer 16 on the second fin 14, which may be suitable for effectively insulating certain fins in CMOS ICs where both N-type FinFETs and P-type FinFETs are formed due to different insulating performance between certain metal oxides for N-type FinFETs and P-type FinFETs. However, it is to be appreciated that in other embodiments, selective masking may be omitted and the same configuration of metal oxide layers may be employed for all fins 12, 14. Further, it is to be appreciated that the second metal oxide layer 22 is optional, and that the methods described herein may be conducted with only the first metal oxide layer 16. Further still, it is to be appreciated that any number of metal oxide layers may be formed in accordance with the methods described herein based upon considerations for effectively insulating the fins 12, 14 from sub-fin current leakage.

Referring again to FIG. 3, the second metal oxide layer 22 is formed over the first metal oxide layer 16 on the second fin 14, which remains exposed after selective masking. The mask 24 may be removed after forming the second metal oxide layer 22. The second metal oxide layer 22 includes a second metal oxide that is different from the first metal oxide, although the second metal oxide may be chosen from the metal oxides set forth above as suitable for the first metal oxide. The second metal oxide layer 22 may be formed through the same techniques as the first metal oxide layer 16, and the second metal oxide layer 22 may have a thickness within the range provided above for the first metal oxide layer 16.

As alluded to above, the second metal oxide layer 22 may be formed to effectively insulate FinFETs that are formed on the second fin 14 and that are different from the FinFETs that are formed on the first fin 12. For example, in an embodiment and referring momentarily to FIG. 10, an N-type FinFET 61 is eventually formed on the second fin 14 and a P-type FinFET 60 is eventually formed on the first fin 12. In a specific example, the second metal oxide layer 22 may include aluminum oxide as the second metal oxide and the first metal oxide layer 16 may include hafnium oxide as the first metal oxide, with the combination of the aluminum oxide and hafnium oxide providing maximized insulation for the N-type FinFETs that are formed on the second fin 14. However, the first metal oxide layer 16 including hafnium oxide may be present alone over the sidewall surfaces 18 of the first fin 12, with the hafnium oxide providing sufficient insulation for the P-type FinFETs that are eventually formed on the first fin 12 to minimize source to drain current leakage between FinFETs.

Figure 4:
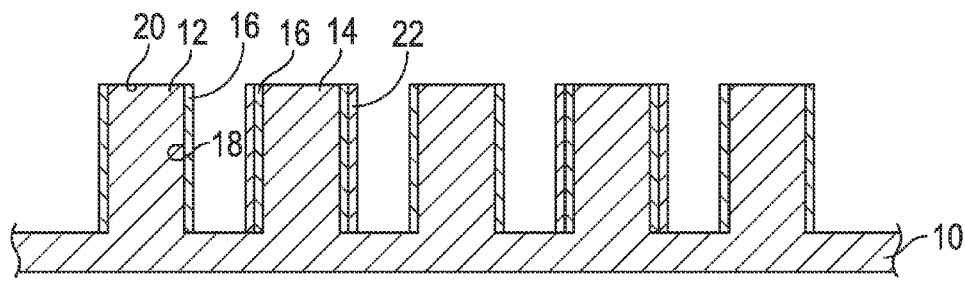

In an embodiment and as shown in FIG. 4, the first metal oxide layer 16 is removed from the top surface 20 of the fins 12, 14 and from a surface of the substrate 10 between the fins 12, 14, and the second metal oxide layer 22 is likewise removed from the top surface 20 of the fins 14 and the surface of the substrate 10 between the fins 12, 14 where present. However, it is to be appreciated that the first metal oxide layer 16 (and the second metal oxide layer 22) may remain on the surface of the substrate 10 between the fins 12, 14. Various techniques may be employed to remove the first metal oxide layer 16 and the second metal oxide layer 22 from the top surface 20 of the fins 12, 14 and from the surface of the substrate 10 between the fins 12, 14, with the particular removal technique controlling whether the metal oxide layers 16, 22 remain on the surface of the substrate 10 between the fins 12, 14. For example, reactive ion etching (RIE) may be employed to remove portions of the first metal oxide layer 16 and the second metal oxide layer 22 that overlie horizontal surfaces, such as the surface of the substrate 10 between the fins 12, 14 and the top surface 20 of the fins 12, 14, while leaving the first metal oxide layer 16 and the second metal oxide layer 22 in place over the sidewall surfaces 18 of the fins 12, 14 as shown in FIG. 4. Alternatively and although not shown, chemical mechanical planarization (CMP) may be employed to remove the first metal oxide layer 16 and the second metal oxide layer 22 from the top surface 20 of the fins 12, 14, while leaving the first metal oxide layer 16 and the second metal oxide layer 22 in place over the sidewall surfaces 18 of the fins 12, 14 and on the surface of the substrate 10 between the fins 12, 14.

Figure 5:
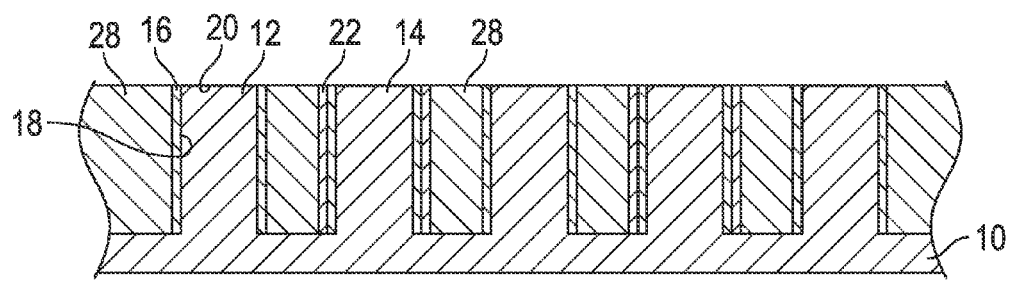

Referring to FIG. 5, a dielectric material that is different from the first metal oxide and the second metal oxide is deposited over the first metal oxide layer 16 and second metal oxide layer 22, where present, and further between the fins 12, 14 to form a dielectric layer 28. Portions of the dielectric material that protrude beyond the top surface 20 of the fins 12, 14 may be removed, such as through CMP, to yield the dielectric layer 28 shown in FIG. 5. Suitable dielectric materials include any dielectric material that has a lower etch rate in any etchant for the first metal oxide and the second metal oxide. Examples of suitable dielectric materials include non-metal dielectrics such as, but not limited to, silicon oxides, silicon nitrides, silicon oxynitrides, and the like.

Figure 6:
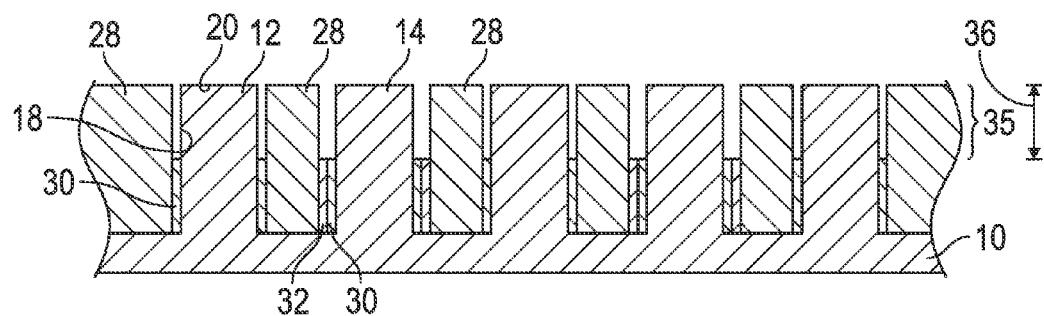

In an embodiment and as shown in FIG. 6, after depositing the dielectric material and forming the dielectric layer 28, the first metal oxide layer 16 and the second metal oxide layer 22 are recessed with an etchant that is selective to the first metal oxide and the second metal oxide over the dielectric material. When the second metal oxide layer 22 is employed, as shown in the Figures, the second metal oxide layer 22 and the first metal oxide layer 16 are concurrently etched. Suitable etchants for the first metal oxide layer 16 and the second metal oxide layer 22 include, but are not limited to, selective Cl-based dry etch (e.g., reactive ion etching) or specific wet chemistries that are selective to the first metal oxide and/or the second metal oxide (e.g. HCl, HFEG, or SC2). The dielectric layer 28 is employed to enable recessing of the first metal oxide layer 16 and the second metal oxide layer 22 through etching while protecting sides of the first metal oxide layer 16 and the second metal oxide layer 22 during etching. Thus, while the etchant is selective to the first metal oxide and the second metal oxide, and the dielectric layer 28 has a lower etch rate than the first metal oxide layer 16 and the second metal oxide layer 22 in the etchant, some etching of the dielectric layer 28 is permissible provided that the first metal oxide layer 16 and the second metal oxide layer 22 are recessed at a faster rate than the dielectric layer 28 to enable protection of sides of the first metal oxide layer 16 or second metal oxide layer 22 that remain after recessing. The first metal oxide layer 16 and the second metal oxide layer 22 are recessed to a depth, indicated by arrows 36, below the top surface 20 of the fins 12, 14 to form a recessed first metal oxide layer 30 and a recessed second metal oxide layer 32. The top surface 20 and the sidewall surfaces 18 of the fins 12, 14 at a top portion 35 of the fins 12, 14 are free from the first metal oxide layer 16 and the second metal oxide layer 22.

Figure 7:
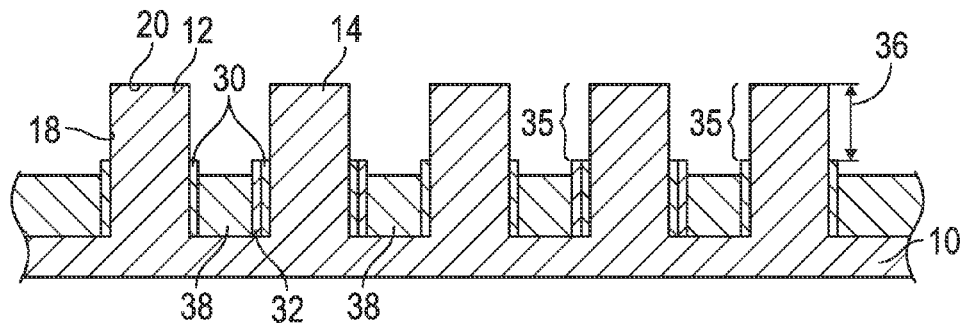

Referring to FIG. 7, after the recessed first metal oxide layer 30 and the recessed second metal oxide layer 32 are formed, a portion of the dielectric layer is removed to a depth of at least the depth 36 of the recessed first metal oxide layer 30 and the recessed second metal oxide layer 32 to form a recessed dielectric layer 38. In particular, the depth 36 of the recessed first metal oxide layer 30 and the recessed second metal oxide layer 32 refers to depth of an uppermost surface of the recessed first metal oxide layer 30 and the recessed second metal oxide layer 32 from the top surface 20 of the fins 12, 14. The recessed dielectric layer 38 is formed because some recessing of the dielectric layer 28 occurs during formation of the recessed first metal oxide layer 30 and the recessed second metal oxide layer 32 (as shown in FIG. 6), thereby rendering the dielectric layer 28 unreliable to control exposure of the fins 12, 14 for subsequent formation of gate electrode structures. Conventional etchants may be employed to remove the portion of the dielectric layer, provided that the etchants are selective to the dielectric material over the first metal oxide and the second metal oxide. Examples of suitable etchants and etching techniques for the dielectric material include, but are not limited to, HCl, SC2, or HFEG wet etch, or selective Cl-based dry etch (e.g., reactive ion etching). Because precise depths of the recessed first metal oxide layer 30 and the recessed second metal oxide layer 32 are unimportant, some etching of the recessed first metal oxide layer 30 and the recessed second metal oxide layer 32 may occur during formation of the recessed dielectric layer 38.

Figure 8:
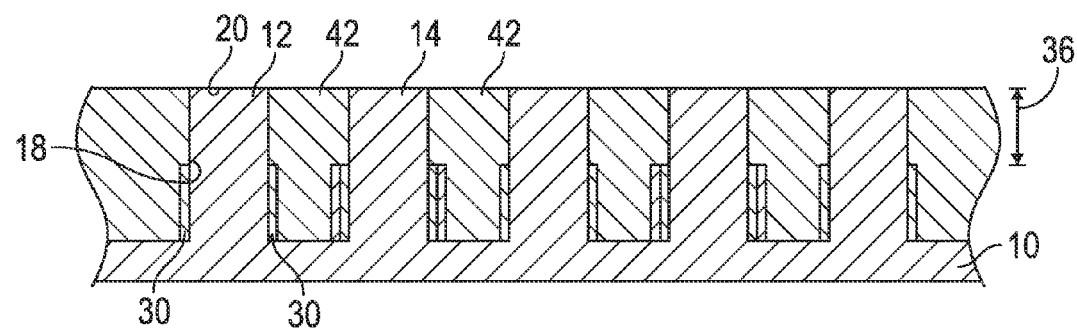

Referring to FIG. 8, additional dielectric material is deposited over the recessed first metal oxide layer 30 and over the recessed second metal oxide layer 32, as well as over the recessed dielectric layer, to form a reformed dielectric layer 40. The additional dielectric material may be the same as the dielectric material that is employed to form the dielectric layer 28 as shown in FIG. 5. Because the recessed dielectric layer is recessed to the depth 36 of the recessed first metal oxide layer 30 and the recessed second metal oxide layer 32, gaps between the fins 12, 14 are sufficiently opened to enable the additional dielectric material to be readily deposited to form the reformed dielectric layer 40 over the recessed first metal oxide layer 30 and the recessed second metal oxide layer 32. In particular, without recessing the dielectric layer, aspect ratios of spaces between the dielectric and the fins 12, 14 that result from recessing the first metal oxide layer and the second metal oxide layer may be too high to enable effective filling.

Figure 9:
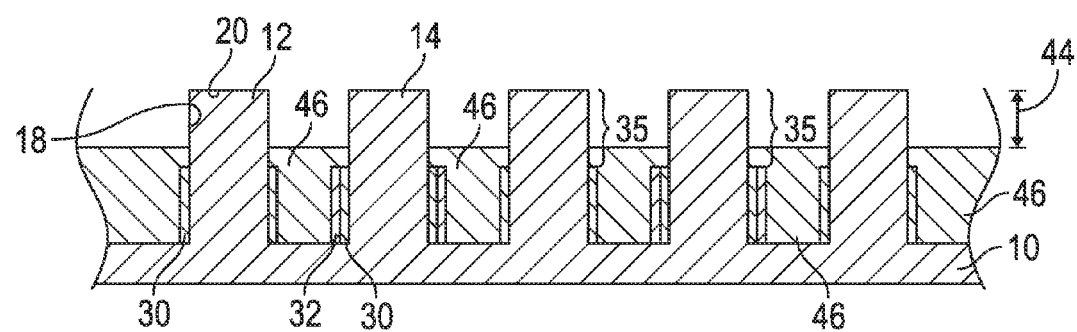

The reformed dielectric layer 40 is formed to enable precise control over fin exposure for subsequent gate electrode formation by reestablishing a surface of the reformed dielectric layer 40 on even plane with the top surface 20 of the fins 12, 14. Referring to FIG. 9, the reformed dielectric layer is recessed to a depth, indicated by double-headed arrow 44, above the recessed first metal oxide layer 30 to form a final dielectric layer 46, thereby exposing at least some of the top portion 35 of the fins 12, 14.

Figure 10:
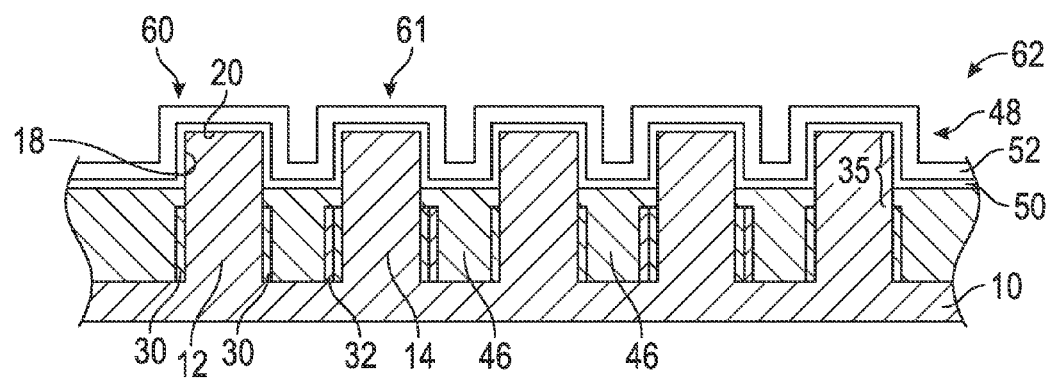

Referring to FIG. 10, a gate electrode structure 48 is formed over the top surface 20 and sidewall surfaces 18 of the fins 12, 14 at the top portion 35 of the fins 12, 14, to form a FinFETs 60, 61 in an integrated circuit 62. The gate electrode structure 48 includes a gate insulating layer 50 and a gate electrode 52 in accordance with conventional gate electrode structure configurations. Although not shown in the Figures, additional conventional front-end-of-line (FEOL) and back-end-of-line (BEOL) techniques may be employed to complete formation of the FinFETs 60, 61 that include the gate electrode structure 48. The recessed first metal oxide layer 30 and the recessed second metal oxide layer 32 are recessed beneath the gate electrode structure 48, due to the configuration of the final dielectric layer 46. In particular, the depth 44 of the final dielectric layer 46 controls depths to which the gate electrode structure 48 extends along the sidewall surfaces 18 of the fins 12, 14. Thus, because the depth of the final dielectric layer 46 is above the recessed first metal oxide layer 30 and the recessed second metal oxide layer 32, the recessed first metal oxide layer 30 and the recessed second metal oxide layer 32 minimize sub-fin current leakage during operation of the FinFETs 60, 61, which include the gate electrode structure 48, but have an immaterial impact on operation of the FinFETs 60, 61.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method of fabricating an integrated circuit having a FinFET, wherein the method comprises:
   providing a substrate comprising fins, wherein the fins comprise semiconductor material;
   forming a first metal oxide layer over sidewall surfaces of the fins, wherein the first metal oxide layer comprises a first metal oxide;
   recessing the first metal oxide layer to a depth below a top surface of the fins to form a recessed first metal oxide layer, wherein the top surface and sidewall surfaces of the fins at a top portion thereof are free from the first metal oxide layer;
   depositing a dielectric material different from the first metal oxide over the first metal oxide layer and between the fins to form a dielectric layer, wherein the dielectric layer is recessed below the top surface of the fins to a depth above the recessed first metal oxide layer;
   forming a gate electrode structure over the top surface and sidewall surfaces of the fins at the top portion thereof and over the dielectric layer, wherein the recessed first metal oxide layer is recessed beneath the gate electrode structure; and
   forming source and drain regions between which a current can flow through a channel under the influence of a bias applied to the gate electrode structure.

2. The method of claim 1, further comprising recessing the first metal oxide layer from the top surface of the fins and from a surface of the substrate between the fins prior to depositing the dielectric material.

3. The method of claim 1, wherein the dielectric material is deposited prior to recessing the first metal oxide layer.

4. The method of claim 3, wherein recessing the first metal oxide layer comprises recessing the first metal oxide layer with an etchant that is selective to the first metal oxide over the dielectric material.

5. The method of claim 1, further comprising forming a second metal oxide layer over the first metal oxide layer prior to recessing the first metal oxide layer, wherein the second metal oxide layer comprises a second metal oxide different from the first metal oxide.

6. The method of claim 5, wherein recessing the first metal oxide layer comprises concurrently recessing the second metal oxide layer and the first metal oxide layer.

7. The method of claim 1, wherein providing the substrate comprising the fins comprises forming the fins in a bulk semiconductor material.

8. The method of claim 1, wherein forming the first metal oxide layer comprises forming the first metal oxide layer through atomic layer deposition.

9. A method of fabricating an integrated circuit having a FinFET, wherein the method comprises:
 providing a substrate comprising fins, wherein the fins comprise semiconductor material;
 forming a first metal oxide layer over sidewall surfaces of the fins, wherein the first metal oxide layer comprises a first metal oxide;
 recessing the first metal oxide layer to a depth below a top surface of the fins to form a recessed first metal oxide layer, wherein the top surface and sidewall surfaces of the fins at a top portion thereof are free from the first metal oxide layer;
 forming a gate electrode structure over the top surface and sidewall surfaces of the fins at the top portion thereof, wherein the recessed first metal oxide layer is recessed beneath the gate electrode structure;
 forming a second metal oxide layer over the first metal oxide layer prior to recessing the first metal oxide layer, wherein the second metal oxide layer comprises a second metal oxide different from the first metal oxide; and
 selectively masking a first fin after forming the first metal oxide layer and prior to forming the second metal oxide layer, wherein the second metal oxide layer is formed on sidewall surfaces of a second fin over the first metal oxide layer on the second fin.

10. The method of claim 9, wherein forming the gate electrode structure comprises forming FinFETs including the gate electrode structure, wherein the FinFETs include an N-type field effect transistor on the second fin and a P-type field effect transistor on the first fin.

11. The method of claim 10, wherein the forming the first metal oxide layer comprises forming the first metal oxide layer comprising hafnium oxide and wherein forming the second metal oxide layer comprises forming the second metal oxide layer comprising aluminum oxide.

12. A method of fabricating an integrated circuit having a FinFET, wherein the method comprises:
 providing a substrate comprising fins, wherein the fins comprise semiconductor material;
 forming a first metal oxide layer over sidewall surfaces of the fins, wherein the first metal oxide layer comprises a first metal oxide;
 selectively masking a first fin after forming the first metal oxide layer, wherein a second fin remains exposed after selectively masking the first fin;
 forming a second metal oxide layer over the first metal oxide layer on the second fin, wherein the second metal oxide layer comprises a second metal oxide different from the first metal oxide;
 depositing a dielectric material different from the first metal oxide and the second metal oxide over the first metal oxide layer and the second metal oxide layer, where present, to form a dielectric layer;
 recessing the first metal oxide layer and the second metal oxide layer, after depositing the dielectric material, with an etchant that is selective to the first metal oxide and the second metal oxide over the dielectric material to a depth below a top surface of the fins to form a recessed first metal oxide layer and a recessed second metal oxide layer, wherein the top surface and sidewall surfaces of the fins at a top portion thereof are free from the first metal oxide layer and the second metal oxide layer;
 removing a portion of the dielectric layer to a depth of at least a depth of the recessed first metal oxide layer to form a recessed dielectric layer;
 depositing additional dielectric material over the recessed first metal oxide layer and over the recessed dielectric layer to form a reformed dielectric layer;
 recessing the reformed dielectric layer to a depth above the recessed first metal oxide layer; and
 forming a gate electrode structure over the top surface and sidewall surfaces of the fins at the top portion thereof, wherein the recessed first metal oxide layer and the recessed second metal oxide layer are recessed beneath the gate electrode structure.

* * * * *